US011515333B2

(12) United States Patent
Song et al.

(10) Patent No.: US 11,515,333 B2
(45) Date of Patent: Nov. 29, 2022

(54) FERROELECTRIC MATERIAL-BASED THREE-DIMENSIONAL FLASH MEMORY, AND MANUFACTURE THEREOF

(71) Applicant: IUCF-HYU (INDUSTRY-UNIVERSITY COOPERATION FOUNDATION HANYANG UNIVERSITY), Seoul (KR)

(72) Inventors: Yun Heub Song, Seoul (KR); Chang Wan Choi, Seoul (KR); Jae Kyeong Jeong, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 0 days.

(21) Appl. No.: 17/422,801

(22) PCT Filed: Dec. 26, 2019

(86) PCT No.: PCT/KR2019/018499
§ 371 (c)(1),
(2) Date: Jul. 14, 2021

(87) PCT Pub. No.: WO2020/204314
PCT Pub. Date: Oct. 8, 2020

(65) Prior Publication Data
US 2022/0130863 A1 Apr. 28, 2022

(30) Foreign Application Priority Data

Mar. 29, 2019 (KR) .................. 10-2019-0036909
Jul. 26, 2019 (KR) .................. 10-2019-0090736

(51) Int. Cl.
*H01L 27/11597* (2017.01)
*G11C 11/22* (2006.01)
(Continued)

(52) U.S. Cl.
CPC ...... *H01L 27/11597* (2013.01); *G11C 11/223* (2013.01); *G11C 11/2275* (2013.01);
(Continued)

(58) Field of Classification Search
CPC ........... H01L 27/11597; H01L 27/1159; H01L 29/516; G11C 11/223; G11C 11/2275; G11C 11/5657
(Continued)

(56) References Cited

U.S. PATENT DOCUMENTS 9,941,299 B1 * 4/2018 Chen ................. H01L 27/11597
10,923,486 B2 * 2/2021 Kabuyanagi ............ H01L 27/24
(Continued)

FOREIGN PATENT DOCUMENTS

JP   60-027160 A   2/1985
JP   10-256512 A   9/1998
(Continued)

OTHER PUBLICATIONS

International Search Report and Written Opinion dated Apr. 13, 2020 from the International Searching Authority in International Application No. PCT/KR2019/018499.

*Primary Examiner* — Fernando Hidalgo
(74) *Attorney, Agent, or Firm* — Sughrue Mion, PLLC

(57) ABSTRACT

Disclosed are: a three-dimensional flash memory in which the degree of integration in a horizontal direction is improved so as to promote integration; and a manufacturing method therefor. A three-dimensional flash memory according to one embodiment comprises: at least one channel layer extending in one direction; at least one ferroelectric film
(Continued)

used as a data storage place while being extended in the one direction so as to encompass the at least one channel layer; and a plurality of electrode layers stacked so as to be vertically connected to the at least one ferroelectric film.

12 Claims, 14 Drawing Sheets

(51) Int. Cl.
*G11C 11/56* (2006.01)
*H01L 27/1159* (2017.01)
*H01L 29/51* (2006.01)

(52) U.S. Cl.
CPC ...... *G11C 11/5657* (2013.01); *H01L 27/1159* (2013.01); *H01L 29/516* (2013.01)

(58) Field of Classification Search
USPC .......................................................... 365/145
See application file for complete search history.

(56) References Cited

U.S. PATENT DOCUMENTS

| 2018/0012123 | A1* | 1/2018 | Han | ........................ G06N 3/049 |
| 2020/0202916 | A1* | 6/2020 | Lee | .......................... G11C 11/22 |
| 2020/0227347 | A1 | 7/2020 | Oh | |

FOREIGN PATENT DOCUMENTS

| JP | 2014-038686 A | 2/2014 |
| JP | 2014-053571 A | 3/2014 |
| JP | 2018-037441 A | 3/2018 |
| KR | 10-1421879 B1 | 7/2014 |
| KR | 10-1511421 B1 | 4/2015 |
| KR | 10-2018-0042358 A | 4/2018 |
| KR | 10-2018-0059271 A | 6/2018 |
| KR | 10-2018-0134122 A | 12/2018 |
| KR | 10-2019-0026418 A | 3/2019 |
| WO | WO-2019/125352 A1 * | 6/2019 |

* cited by examiner

300

FIG. 8
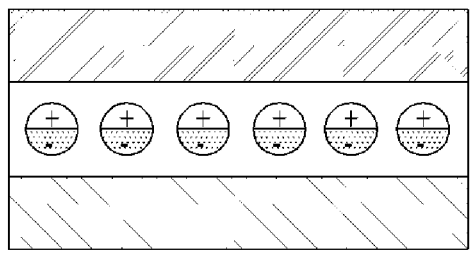
(a) Binary data (00)
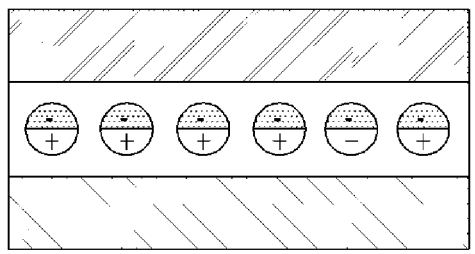
(b) Binary data (11)
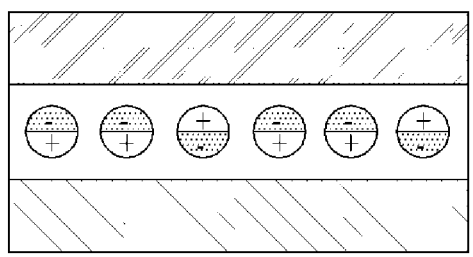
(c) Binary data (01)
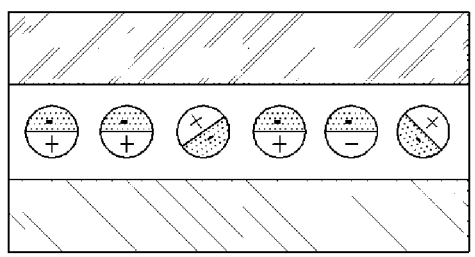
(d) Binary data (10)

<u>1300</u>

FERROELECTRIC MATERIAL-BASED THREE-DIMENSIONAL FLASH MEMORY, AND MANUFACTURE THEREOF

CROSS REFERENCE TO RELATED APPLICATIONS

This application is a National Stage of International Application No. PCT/KR2019/018499 filed Dec. 26, 2019, claiming priorities based on Korean Patent Application No. 10-2019-0036909 filed Mar. 29, 2019 and Korean Patent Application No. 10-2019-0090736 filed Jul. 26, 2019.

TECHNICAL FIELD

Embodiments relate to a three-dimensional flash memory, and more particularly, relate to a three-dimensional flash memory capable of improving the degree of integration in a horizontal direction and a manufacturing method thereof.

BACKGROUND ART

A flash memory device that is an electrically erasable programmable read only memory (EEPROM) may be used in common, for example, in a computer, a digital camera, an MP3 player, a game system, a memory stick, etc. The flash memory device electrically programs/erases data by using the F-N (Fowler-Nordheim) tunneling or the hot electron injection.

In detail, referring to FIG. 1 showing an array of a conventional three-dimensional flash memory, the array of the three-dimensional flash memory may include a common source line CSL, a bit line BL, and a plurality of cell strings CSTR interposed between the common source line CSL and the bit line BL.

Bit lines are arranged two-dimensionally, and a plurality of cell strings CSTR are connected in parallel with each of the bit lines. The cell strings CSTR may be connected in common with the common source line CSL. That is, a plurality of cell strings CSTR may be disposed between a plurality of bit lines and one common source line CSL. In this case, the common source line CSL may include a plurality of common source lines, and the plurality of common source lines CSL may be two-dimensionally arranged. Here, the same voltage may be electrically applied to the plurality of common source lines CSL, or the plurality of common source lines CSL may be electrically controlled independently of each other.

Each of the cell strings CSTR may include a ground selection transistor GST connected with the common source line CSL, a string selection transistor SST connected with the bit line BL, and a plurality of memory cell transistors MCT interposed between the ground selection transistor GST and the string selection transistor SST. In each cell string CSTR, the ground selection transistor GST, the string selection transistor SST, and the memory cell transistors MCT may be connected in series.

The common source line CSL may be connected in common sources of the ground selection transistors GST. In addition, a ground selection line GSL, a plurality of word lines WL0 to WL3, and a plurality of string selection lines SSL, which are disposed between the common source line CSL and the bit line BL, may be respectively used as gate layers of the ground selection transistors GST, the memory cell transistors MCT, and the string selection transistors SST. Also, each of the memory cell transistors MCT includes a memory element.

Meanwhile, a conventional three-dimensional flash memory may increase the degree of integration by vertically stacking cells to satisfy requirements of a consumer such as an excellent performance and a low price.

For example, referring to FIG. 2 showing a structure of a conventional three-dimensional flash memory, the conventional three-dimensional flash memory is manufactured by arranging electrode structures 215 in which interlayer insulating layers 211 and horizontal structures 250 are formed alternately and repeatedly on a substrate 200. The interlayer insulating layers 211 and the horizontal structures 250 may be extended in a first direction. The interlayer insulating layers 211 may be, for example, a silicon oxide layer, and the lowest interlayer insulating layer 211a of the interlayer insulating layers 211 may be smaller in thickness than the remaining interlayer insulating layers 211. Each of the horizontal structures 250 may include a first blocking insulating layer 242, a second blocking insulating layer 243, and an electrode layer 245. The conventional three-dimensional flash memory may include a plurality of electrode structures 215, and the plurality of electrode structures 215 may be arranged to face each other in a second direction intersecting the first direction. The first direction and the second direction may correspond to an x-axis and a y-axis of FIG. 2, respectively. Trenches 240 may be extended in the first direction such that the plurality of electrode structures 215 are spaced from each other. Impurity regions doped with impurities of a high concentration may be formed in the substrate 200 exposed by the trenches 240 such that the common source line CSL is disposed. Although not illustrated, device isolation layers filling the trenches 240 may be further disposed.

Vertical structures 230 penetrating the electrode structures 215 may be disposed. For example, in a plan view, the vertical structures 230 may be aligned along the first and second directions so as to be disposed in a matrix form. For another example, the vertical structures 230 may be aligned in the second direction and may be arranged in the first direction in a zig-zag form. Each of the vertical structures 230 may include a protection layer 224, a charge storage layer 225, a tunnel insulating layer 226, and a channel layer 227. For example, the channel layer 227 may be formed in the form of a hallow tube; in this case, a buried layer 228 filling the inside of the channel layer 227 may be further formed. A drain region "D" may be disposed over the channel layer 227, and a conductive pattern 229 may be formed on the drain region "D" so as to be connected with a bit line BL. The bit line BL may be extended in a direction intersecting the horizontal electrodes 250, for example, the second direction. For example, the vertical structures 230 aligned in the second direction may be connected with one bit line BL.

The first and second blocking insulating layers 242 and 243 included in the horizontal structure 250 and the charge storage layer 225 and the tunnel insulating layer 226 included in the vertical structure 230 may be defined as an oxide-nitride-oxide (ONO) layer being an information storage element. That is, a portion of the information storage element may be included in the vertical structure 230, and the remaining portion thereof may be included in the horizontal structure 250. For example, the charge storage layer 225 and the tunnel insulating layer 226 of the information storage element may be included in the vertical structure 230, and the first and second blocking insulating layers 242 and 243 may be included in the horizontal structure 250, but are not limited thereto. For example, the charge storage layer 225 and the tunnel insulating layer 226 defined as the ONO layer may be implemented to be included only in the vertical structures 230.

Epitaxial patterns 222 may be disposed between the substrate 200 and the vertical structures 230. The epitaxial patterns 222 connect the substrate 200 and the vertical structures 230. The epitaxial patterns 222 may be in contact with the horizontal structures 250 in at least one layer. That is, the epitaxial patterns 222 may be disposed to be in contact with the lowest horizontal structure 250a. According to another embodiment, the epitaxial patterns 222 may be disposed to be in contact with the horizontal structures 250 in a plurality of layers, for example, two layers. Meanwhile, in the case where the epitaxial patterns 222 are disposed to be in contact with the lowest horizontal structure 250a, the lowest horizontal structure 250a may be thicker in thickness than the remaining horizontal structures 250. The lowest horizontal structure 250a being in contact with the epitaxial patterns 222 may correspond to the ground selection line GSL of the array in the three-dimensional flash memory described with reference to FIG. 1, and the remaining horizontal structures 250 being in contact with the vertical structures 230 may correspond to the plurality of word lines WL0 to WL3, respectively.

Each of the epitaxial patterns 222 includes a recessed side wall 222a. As such, the lowest horizontal structure 250a being in contact with the epitaxial patterns 222 is disposed along a profile of the recessed side wall 222a. That is, the lowest horizontal structure 250a may be disposed to be convex inwardly along the recessed side wall 222a of the epitaxial pattern 222.

The existing three-dimensional flash memory with the above structure have difficulty of the scaling in a horizontal direction because the ONO layer included in the vertical structure 230 is 40 nm thick, and requires a high operation voltage of 20 V due to an F-N (Fowler-Nordheim) tunneling operation according to a characteristic of a charge trap flash (CTF) using the ONO layer.

Accordingly, a technique for overcoming the above shortcomings is required.

DETAILED DESCRIPTION OF THE INVENTION

Technical Problem

Embodiments provide a three-dimensional flash memory, which is capable of improving the degree of integration in a horizontal direction and improving a reliability characteristic through a low operation voltage together with the improvement of the degree of integration, by using a ferroelectric layer formed of a single thin layer as data storage, and a manufacturing method thereof.

Also, embodiments provide a three-dimensional flash memory, which is capable of increasing a cell current, decreasing a leakage current, and improving a temperature-resistant reliability characteristic by forming a channel layer 300 with a semiconductor material including Zn, In, Ga, a Group 4 semiconductor material, or a Group 3-5 compound having a C-axis aligned crystal (CAAC) crystal structure, and a manufacturing method thereof.

Also, embodiments provide a three-dimensional flash memory capable of implementing a multi-level for a ferroelectric layer-based data storage component and an operating method thereof.

Technical Solution

According to an embodiment, a three-dimensional flash memory includes at least one channel layer extended and formed in one direction; at least one ferroelectric layer extended and formed in the one direction to surround the at least one channel layer and used as data storage; and a plurality of electrode layers stacked to be vertically connected to the at least one ferroelectric layer.

According to one aspect, the at least one ferroelectric layer may be formed to implement a plurality of memory cells in regions thereof being in contact with the plurality of electrode layers and to satisfy a condition where a turn-on voltage of the at least one channel layer is smaller than an operation voltage of each of the memory cells and is greater than a threshold voltage when each of the memory cells is programmed.

According another one aspect, a thickness of the at least one ferroelectric layer may be adjusted to satisfy the condition.

According another one aspect, the at least one ferroelectric layer may be formed of a ferroelectric material of $HfO_2$ with an orthorhombic crystal structure.

According another one aspect, the at least one ferroelectric layer may be formed of a ferroelectric material including at least one of $PZT(Pb(Zr, Ti)O_3)$, $PTO(PbTiO_3)$, $SBT$ $(SrBi_2Ti_2O_3)$, $BLT(Bi(La, Ti)O_3)$, $PLZT(Pb(La, Zr)TiO_3)$, $BST(Bi(Sr, Ti)O_3)$, barium titanate $(BaTiO_3)$, P(VDF-TrFE), PVDF, $AlO_x$, $ZnO_x$, $TiO_x$, $TaO_x$ or $InO_x$.

According another one aspect, the at least one channel layer may be formed of a semiconductor material including Zn, In, Ga, a Group 4 semiconductor material or a Group 3-5 compound having a C-axis aligned crystal (CAAC) crystal structure.

According to an embodiment, at least one ferroelectric layer may be provided which is used in a three-dimensional flash memory including at least one channel layer extended and formed in one direction and a plurality of electrode layers stacked vertically to the at least one channel layer. The at least one ferroelectric layer may be extended and formed in the one direction to surround the at least one channel layer, may be used as data storage, and may be formed to implement a plurality of memory cells in regions thereof being in contact with the plurality of electrode layers and to satisfy a condition where a turn-on voltage of the at least one channel layer is smaller than an operation voltage of each of the memory cells and is greater than a threshold voltage when each of the memory cells is programmed.

According to an embodiment, a method of manufacturing a three-dimensional flash memory includes preparing, on a substrate, a mold structure in which a plurality of interlayer insulating layers and a plurality of electrode layers are stacked alternately; extending and forming at least one string hole, which penetrates the mold structure to expose the substrate, in one direction; extending and forming at least one ferroelectric layer used as data storage in the at least one string hole, wherein the at least one ferroelectric layer includes a vertical hole therein; and extending and forming at least one channel layer in the vertical hole of the at least one ferroelectric layer in the one direction.

According to an embodiment, a method of manufacturing a three-dimensional flash memory may include preparing, on a substrate, a mold structure in which a plurality of interlayer insulating layers and a plurality of sacrificial layers are stacked alternately; extending and forming at least one string hole, which penetrates the mold structure to expose the substrate, in one direction; extending and forming at least one ferroelectric layer used as data storage in the at least one string hole, wherein the at least one ferroelectric layer includes a vertical hole therein; extending and forming at least one channel layer in the vertical hole of the at least one ferroelectric layer in the one direction; and removing the plurality of sacrificial layers and filling a plurality of electrode layers in spaces in which the plurality of sacrificial layers are removed.

According to an embodiment, a ferroelectric material-based three-dimensional flash memory which implements a multi-level, the three-dimensional flash memory includes at least one channel layer extended and formed in one direction on a substrate; a plurality of electrode layers stacked to be perpendicular to the at least one channel layer; and at least one ferroelectric layer interposed between the at least one channel layer and the plurality of electrode layers in the one direction to surround the at least one channel layer and used as data storage to implement a plurality of memory cells in regions thereof being in contact with the plurality of electrode layers, and a multi-level for a target memory cell targeted for a program operation of the plurality of memory cells is implemented by changing a polarization charge amount of a partial region of the at least one ferroelectric layer corresponding to the target memory cell.

According another one aspect, the three-dimensional flash memory may adjust a program voltage to be applied to the target memory cell between a negative value and a positive value to change the polarization charge amount of the at least one ferroelectric layer.

According another one aspect, the three-dimensional flash memory may apply program voltages of different negative values and a program voltage of a positive value to the target memory cell between a negative value and a positive value to change the polarization charge amount of the at least one ferroelectric layer.

According another one aspect, the three-dimensional flash memory may adjust a program voltage to be applied to the target memory cell between a negative value and a positive value such that the number of polarized atoms or a polarization rotation angle in the partial region of the at least one ferroelectric layer changes, and changes the polarization charge amount depending on the number of polarized atoms or the polarization rotation angle thus controlled.

According to an embodiment, a multi-level implementing method of a three-dimensional flash memory which includes at least one channel layer extended and formed in one direction on a substrate, a plurality of electrode layers stacked in a direction perpendicular to the at least one channel layer, and at least one ferroelectric layer interposed between the at least one channel layer and the plurality of electrode layers in the one direction to surround the at least one channel layer and used as data storage to implement a plurality of memory cells in regions thereof being in contact with the plurality of electrode layers includes determining a range of a program voltage to be applied to a target memory cell targeted for a program operation from among the plurality of memory cells, between a negative value and a positive value; adjusting the program voltage to be applied to the target memory cell in a range between a negative value and a positive value according to the determination result; and implementing a multi-level of the target memory cell by changing a polarization charge amount of a partial region of the at least one ferroelectric layer corresponding to the target memory cell, as the program voltage to be applied to the target memory cell is adjusted.

According another one aspect, the determining may include determining the range of the program voltage to be applied to the target memory cell between a negative value and a positive value, based on a thickness of the at least one ferroelectric layer and a breakdown voltage of the at least one ferroelectric layer.

Advantageous Effects of the Invention

Embodiments may provide a three-dimensional flash memory, which is capable of improving the degree of integration in a horizontal direction and improving a reliability characteristic through a low operation voltage together with the improvement of the degree of integration, by using a ferroelectric layer formed of a single thin layer as data storage, and a manufacturing method thereof.

Also, embodiments may provide a three-dimensional flash memory, which is capable of increasing a cell current, decreasing a leakage current, and improving a temperature-resistant reliability characteristic by forming a channel layer 300 with a semiconductor material including Zn, In, Ga, a Group 4 semiconductor material, or a Group 3-5 compound having a C-axis aligned crystal (CAAC) crystal structure, and a manufacturing method thereof.

Also, embodiments may provide a three-dimensional flash memory capable of implementing a multi-level for a ferroelectric layer-based data storage component and an operating method thereof.

DESCRIPTION OF THE DRAWINGS

FIGS. 8 and 9 are diagrams for describing a multi-level of a three-dimensional flash memory according to an embodiment.

BEST MODE

Figure 1:
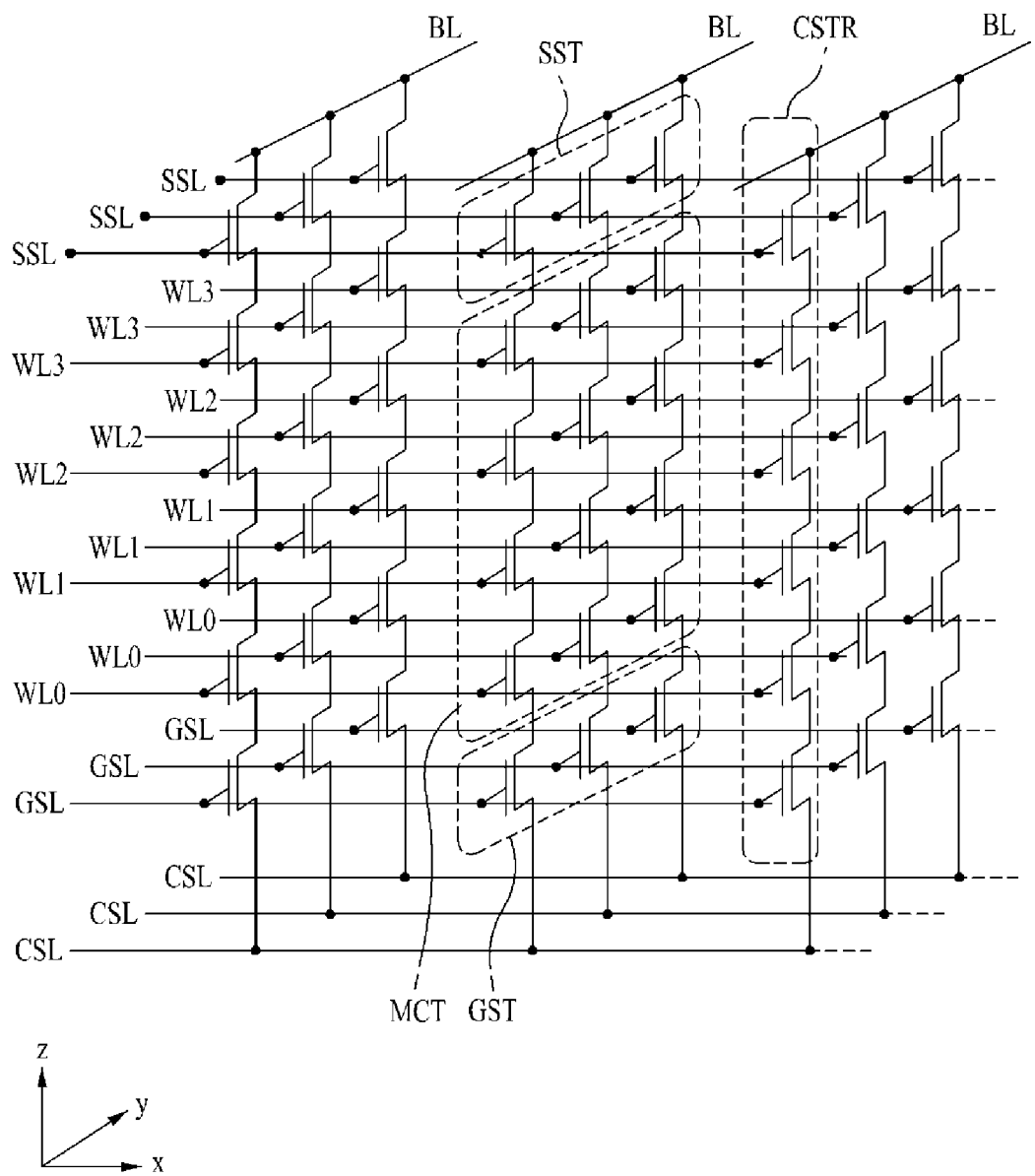
FIG. 1 is a circuit diagram illustrating an array of a conventional three-dimensional flash memory.

Hereinafter, embodiments will be described in detail with reference to the accompanying drawings. However, the inventive concept are not limited or restricted by the embodiments.

Further, the same reference signs/numerals in the drawings denote the same members. Furthermore, the terminologies used herein are used to properly express the embodiments of the inventive concept, and may be changed according to the intentions of the user or the manager or the custom in the field to which the inventive concept pertains. Accordingly, definition of the terms should be made according to the overall disclosure set forth herein.

Figure 3:
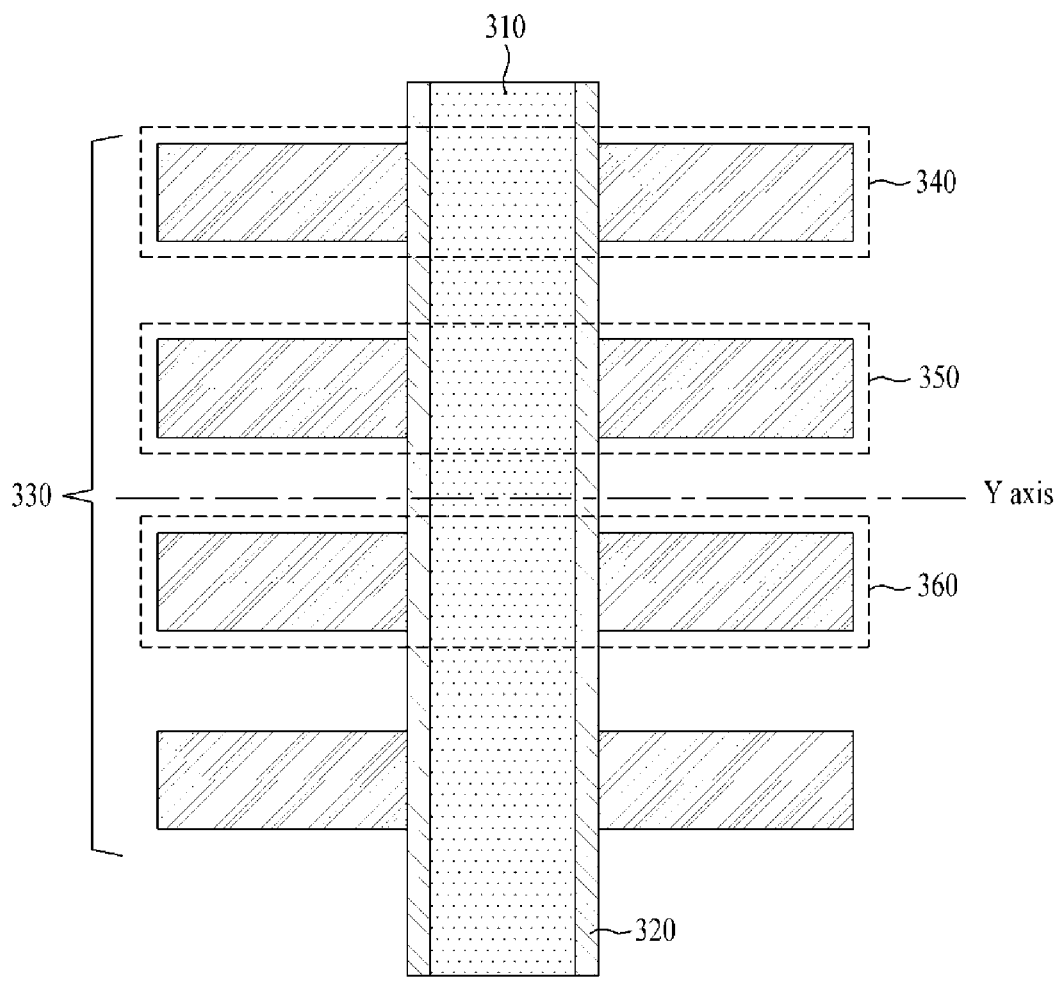
FIG. 3 is a cross-sectional view illustrating a three-dimensional flash memory according to an embodiment.
Figure 4:
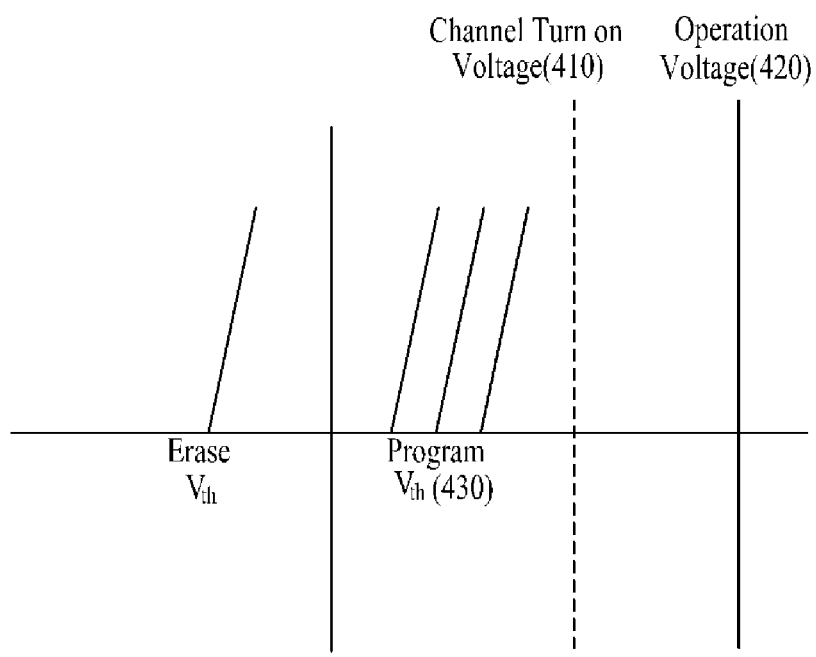
FIG. 4 is a diagram for a memory characteristic of a three-dimensional flash memory according to an embodiment.

FIG. 3 is a cross-sectional view illustrating a three-dimensional flash memory according to an embodiment, and FIG. 4 is a diagram for a memory characteristic of a three-dimensional flash memory according to an embodiment.

Referring to FIGS. 3 and 4, a three-dimensional flash memory 300 according to an embodiment includes at least one channel layer 310, at least one ferroelectric layer 320, and a plurality of electrode layers 330.

Figure 2:
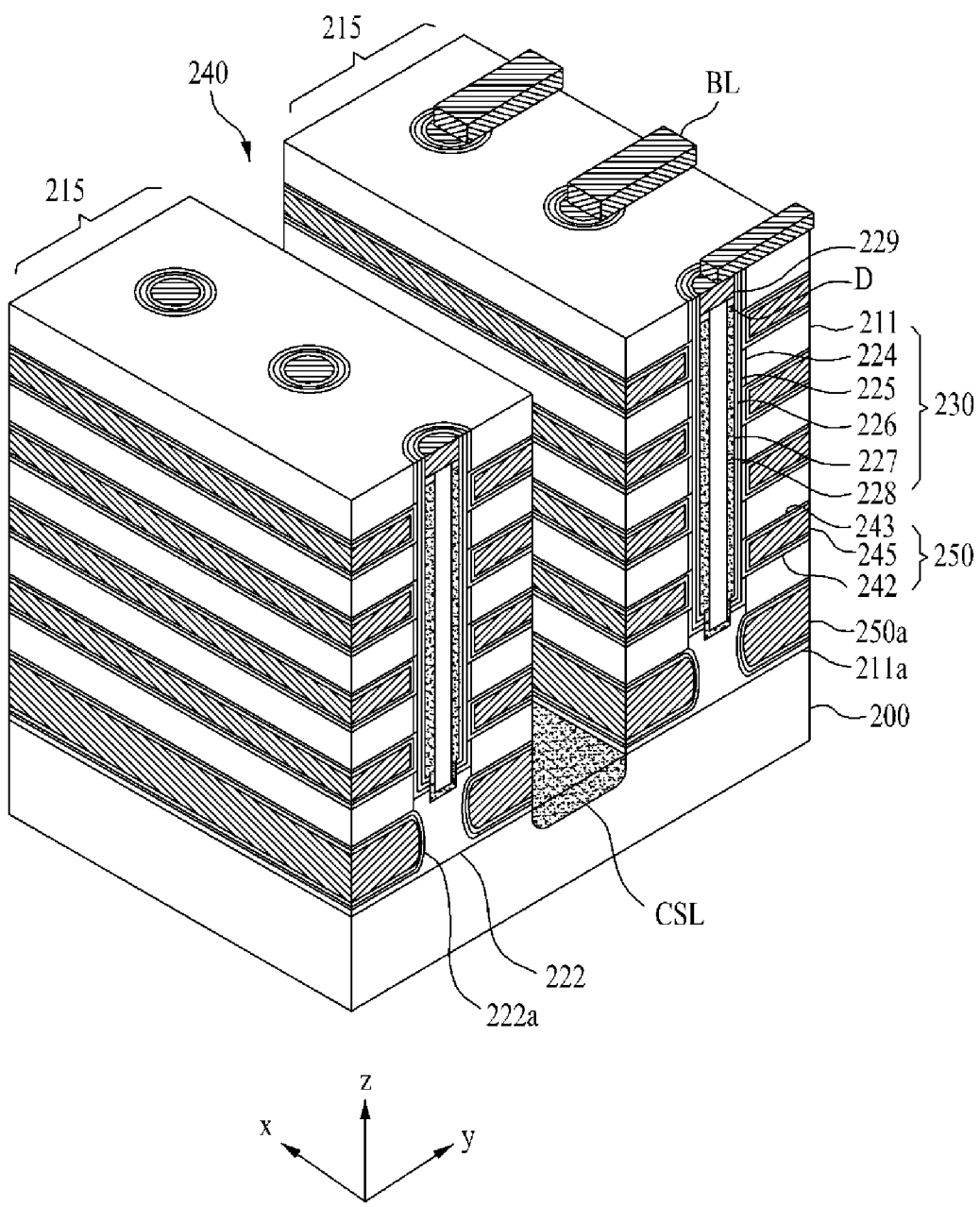
FIG. 2 is a perspective view illustrating a structure of a conventional three-dimensional flash memory.

The at least one channel layer 310 may be extended and formed in one direction (e.g., the z-axis direction in FIG. 2) on a substrate (not illustrated). In this case, the at least one channel layer 310 may be formed by a selective epitaxial growth process or a phase change epitaxial process in which a substrate is used as a seed, and may further include a buried layer (not illustrated) that is disposed in a hollow tubular shape so as to fill the inside thereof as illustrated in FIG. 2.

The at least one channel layer 310 may be formed of a semiconductor material including Zn, In, Ga, a Group 4 semiconductor material, or a Group 3-5 compound having a C-axis aligned crystal (CAAC) crystal structure. As such, a cell current may increase, a leakage current may decrease, and a temperature-resistant reliability characteristic may be improved. For example, the at least one channel layer 310 may be formed of a $ZnO_x$-based material including at least one of AZO, ZTO, IZO, ITO, IGZO, and Ag—ZnO. However, the at least one channel layer 310 is not limited thereto, and may be formed of single crystal silicon or poly-silicon like a conventional channel layer.

Also, although not illustrated in drawing, a drain line (not illustrated) may be connected on the at least one channel layer 310.

The at least one ferroelectric layer 320 is extended and formed in one direction to surround the at least one channel layer 310 and is used as data storage. For example, the at least one ferroelectric layer 320 may be formed of a ferroelectric material of $HfO_2$ having an orthorhombic crystal structure, and more specifically, may be formed of a ferroelectric material of $HfO_2$ doped with at least one material of Al, Zr, or Si. For another example, the at least one ferroelectric layer 320 may be formed of a ferroelectric material including at least one of PZT(Pb(Zr, Ti)$O_3$), PTO(PbTi$O_3$), SBT(SrBi$_2$Ti$_2$O$_9$), BLT(Bi(La, Ti)$O_3$), PLZT(Pb(La, Zr)Ti$O_3$), BST(Bi(Sr, Ti)$O_3$), barium titanate (BaTi$O_3$), P(VDF-TrFE), PVDF, $AlO_x$, $ZnO_x$, $TiO_x$, $TaO_x$ or $InO_x$.

Below, that it is used as data storage means indicating (or storing) a value of binary data by using a voltage change according to a polarization phenomenon of a ferroelectric material forming the at least one ferroelectric layer 320.

In this case, because the at least one ferroelectric layer 320 is implemented with a single thin layer of 20 nm or less by using a ferroelectric material, a thickness of the at least one ferroelectric layer 320 may be markedly thin compared to the existing ONO layer. Accordingly, a low operation voltage may be used compared to a three-dimensional flash memory using the existing ONO layer, and the degree of integration in the horizontal direction may be improved. However, it is not limited or restricted thereto. For example, the at least one ferroelectric layer 320 may be formed of a plurality of thin layers, as well as a single thin layer. In this case, a total thickness of the plurality of thin layers may be maintained at 20 nm or less.

In particular, the at least one ferroelectric layer 320 may be formed to have an operation voltage appropriate for a stable turn-on of the at least one channel layer 310. In more detail, the at least one ferroelectric layer 320 is formed to satisfy a condition (i.e., a condition of Equation 1 below) where a turn-on voltage of the at least one channel layer 310 is smaller than an operation voltage of each of memory cells 340, 350, and 360 and is greater than a threshold voltage when each of the memory cells 340, 350, and 360 is programmed. For example, as illustrated in FIG. 4, it should be satisfied a condition where a turn-on voltage 410 of the at least one channel layer 310 is smaller than an operation voltage 420 of each of the memory cells 340, 350, and 360 and is greater than a threshold voltage 430 when each of the memory cells 340, 350, and 360 is programmed. In more detail, it should be satisfied a condition where a turn-on voltage of the at least one channel layer 310 that is 6 V (±6V) is smaller than 8V (±8V) being an operation voltage of each of the memory cells 340, 350, and 360 and is greater than 3V (±3V) being a threshold voltage when each of the memory cells 340, 350, and 360 is programmed. Below, the plurality of memory cells 340, 350, and 360 may be implemented in regions where the at least one ferroelectric layer 320 and the plurality of electrode layers 330 are in contact with each other.

$$\text{Cell Operation Voltage} > V_{pass} > V_{th} \qquad \text{[Equation 1]}$$

In Equation 1 above, "Cell Operation Voltage" means an operation voltage of each of the memory cells 340, 350, and 360, "Vpass" means a turn-on voltage of the at least one channel layer 310, and "Vth" means a threshold voltage when each of the memory cells 340, 350, and 360 is programmed.

The above condition may be satisfied as a thickness of the at least one ferroelectric layer 320 is adjusted. That is, a thickness of the at least one ferroelectric layer 320 may be adjusted to satisfy the condition where the turn-on voltage of the at least one channel layer 310 is smaller than the operation voltage of each of the memory cells 340, 350, and 360 and is greater than a threshold voltage when each of the memory cells 340, 350, and 360 is programmed.

Also, the above condition may be satisfied depending on a ferroelectric material forming the at least one ferroelectric layer 320, as well as the thickness of the at least one ferroelectric layer 320. For example, to satisfy the condition where the turn-on voltage of the at least one channel layer 310 is smaller than the operation voltage of each of the memory cells 340, 350, and 360 and is greater than a threshold voltage when each of the memory cells 340, 350, and 360 is programmed, the at least one ferroelectric layer 320 may be formed of a ferroelectric material of $HfO_2$ doped with at least one of Zr and Si to have a high polarization voltage.

The above characteristics may allow the three-dimensional flash memory 300 according to an embodiment to be applied to string operations (e.g., a program operation, an erase operation, and a read operation) of an existing three-dimensional flash memory without modification.

Also, the at least one ferroelectric layer 320 may have a multi-level based on the degree of a polarization phenomenon, that is, may have a multi-bit characteristic indicating data of a plurality of bits. The at least one ferroelectric layer 320 may be formed by using an atomic layer deposition (ALD) process to enable step coverage and nano-level thickness control.

The plurality of electrode layers 330 are stacked to be vertically connected to the at least one ferroelectric layer 320 and are extended and formed in another direction (e.g., the y-axis direction in FIG. 2) perpendicular to the one direction. A conductive material such as tungsten, titanium, or tantalum may be used as a material for forming the plurality of electrode layers 330.

In the case of programming state "0" in which a threshold voltage is high, the three-dimensional flash memory 300 with the above structure may apply an operation voltage for generating polarization to a gate electrode, with a voltage of the at least one channel layer 310 maintained at 0 V or an appropriate reference voltage. In contrast, in the case of storing state "1" in which a threshold voltage is low (i.e., in the case of programming an erase state), the three-dimensional flash memory 300 may apply an operation voltage for inverting an existing polarization state to the at least one channel layer 310, with a gate voltage maintained at 0 V or an appropriate reference voltage.

As the three-dimensional flash memory 300 according to an embodiment uses the at least one ferroelectric layer 320 formed of a single thin layer as data storage, the degree of integration in the horizontal direction may be improved, and a reliability characteristic may be improved through a low operation voltage together with the improvement of the degree of integration. Also, as the at least one channel layer 310 of the three-dimensional flash memory 300 is formed of a semiconductor material including Zn, In, Ga, a Group 4 semiconductor material, or a Group 3-5 compound having a C-axis aligned crystal (CAAC) crystal structure, a cell current may increase, a leakage current may decrease, and a temperature-resistant reliability characteristic may be improved. A method of manufacturing the three-dimensional flash memory 300 will be described in detail with reference to FIGS. 5 and 6.

Figure 5:
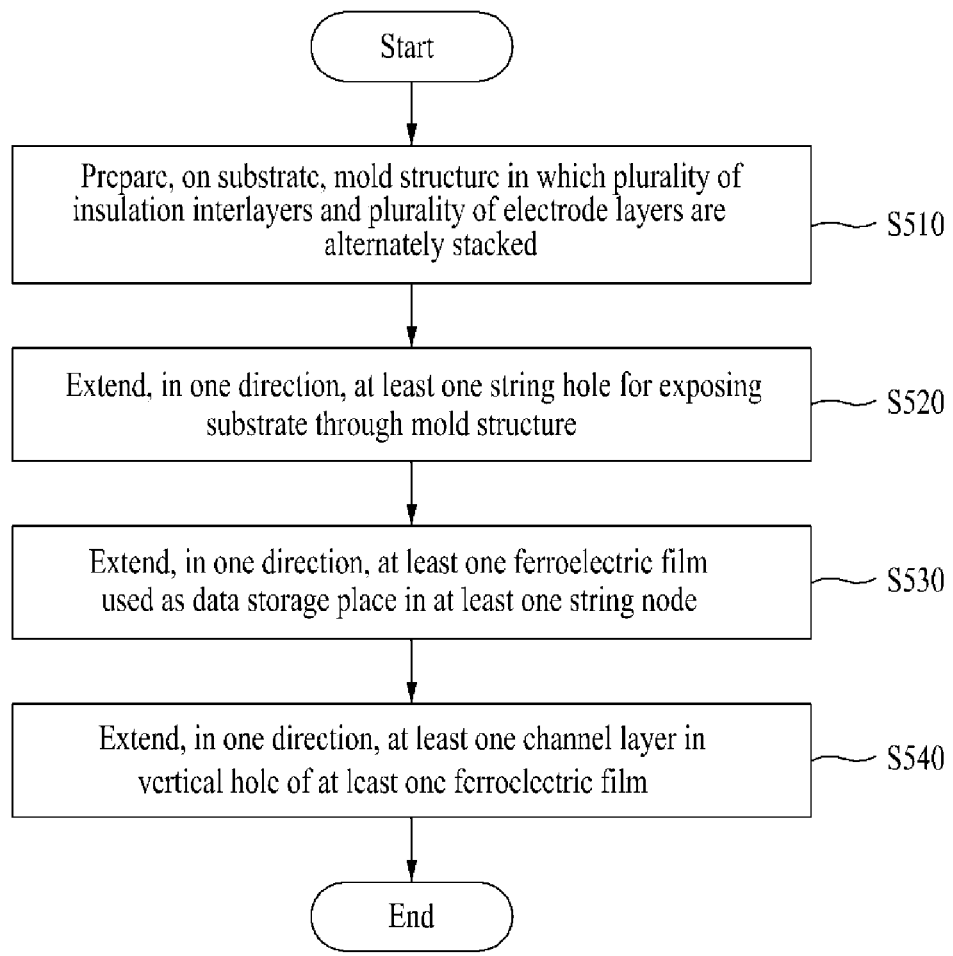
FIG. 5 is a flowchart illustrating a three-dimensional flash memory manufacturing method according to an embodiment.

FIG. 5 is a flowchart illustrating a three-dimensional flash memory manufacturing method according to an embodiment.

Below, a three-dimensional flash memory manufactured by the three-dimensional flash memory manufacturing method includes the structure described above. Also, below, an automated and mechanized manufacturing system may be used as the subject performing the three-dimensional flash memory manufacturing method.

Referring to FIG. 5, in step S510, the manufacturing system prepares, on a substrate, a mold structure in which a plurality of interlayer insulating layers and a plurality of electrode layers are stacked alternately.

Next, in step S520, the manufacturing system extends and forms at least one string hole, which penetrates the mold structure to expose the substrate, in one direction.

Then, in step S530, the manufacturing system extends and forms at least one ferroelectric layer (the at least one ferroelectric layer including a vertical hole therein), which is used as data storage, in the at least one string hole. For example, the manufacturing system may form at least one ferroelectric layer using a ferroelectric material of $HfO_2$ having an orthorhombic crystal structure. In more detail, the manufacturing system may form at least one ferroelectric layer using a ferroelectric material of $HfO_2$ doped with at least one of Al, Zr, and Si.

In particular, in step S530, the manufacturing system may implement a plurality of memory cells in regions being in contact with the plurality of electrode layers on the at least one ferroelectric layer, and may form the at least one ferroelectric layer such that there is satisfied the condition where a turn-on voltage of at least one channel layer is smaller than an operation voltage of each memory cell and is greater than a threshold voltage when each memory cell is programmed.

In more detail, to satisfy the above condition, the manufacturing system may adjust a thickness of the at least one ferroelectric layer or may selectively determine a ferroelectric material for forming the at least one ferroelectric layer. For example, to satisfy the above condition, the manufacturing system may form at least one ferroelectric layer with a ferroelectric material of $HfO_2$ doped with at least one of Zr and Si to have a high polarization voltage.

Afterwards, in step S540, the manufacturing system extends and forms the at least one channel layer in the vertical hole of the at least one ferroelectric layer in one direction. In this case, the manufacturing system may form the at least one channel layer with a semiconductor material including Zn, In, Ga, a Group 4 semiconductor material or a Group 3-5 compound having a C-axis aligned crystal (CAAC) crystal structure.

In the three-dimensional flash memory manufacturing method according to an embodiment, the manufacturing system may continuously perform step S530 and step S540 by using the ALD (Atomic Layer Deposition) process.

The three-dimensional flash memory manufacturing method described above is not limited or restricted to step S510 to step S540, and may include various steps for manufacturing the three-dimensional flash memory described with reference to FIG. 3. For example, the three-dimensional flash memory described with reference to FIG. 3 may be manufactured by using a mold structure including a plurality of sacrificial layers, not a mold structure including a plurality of electrode layers. This will be described in detail with reference to FIG. 6.

Figure 6:
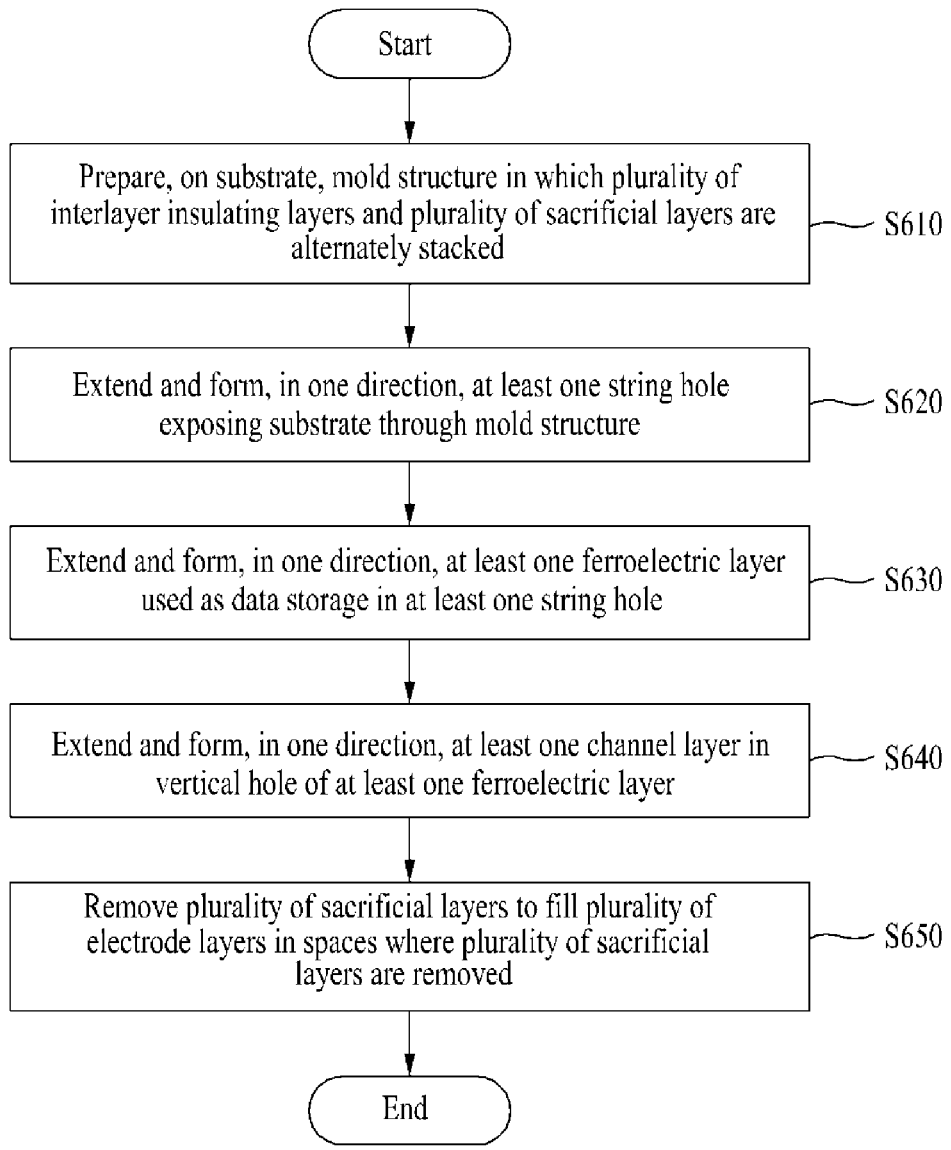
FIG. 6 is a flowchart illustrating a three-dimensional flash memory manufacturing method according to another embodiment.

FIG. 6 is a flowchart illustrating a three-dimensional flash memory manufacturing method according to another embodiment.

Below, a three-dimensional flash memory manufactured by the three-dimensional flash memory manufacturing method includes the structure described above. Also, below, an automated and mechanized manufacturing system may be used as the subject performing the three-dimensional flash memory manufacturing method.

Referring to FIG. 6, in step S610, the manufacturing system prepares, on a substrate, a mold structure in which a plurality of interlayer insulating layers and a plurality of sacrificial layers are stacked alternately.

Next, in step S620, the manufacturing system extends and forms at least one string hole, which penetrates the mold structure to expose the substrate, in one direction.

Then, in step S630, the manufacturing system extends and forms at least one ferroelectric layer (the at least one ferroelectric layer including a vertical hole therein), which is used as data storage, in the at least one string hole. For example, the manufacturing system may form at least one ferroelectric layer using a ferroelectric material of $HfO_2$ having an orthorhombic crystal structure. In more detail, the manufacturing system may form at least one ferroelectric layer using a ferroelectric material of $HfO_2$ doped with at least one of Al, Zr, and Si.

In particular, in step S630, the manufacturing system may implement a plurality of memory cells in regions being in contact with the plurality of electrode layers on the at least one ferroelectric layer, and may form the at least one ferroelectric layer such that there is satisfied the condition where a turn-on voltage of at least one channel layer is smaller than an operation voltage of each memory cell and is greater than a threshold voltage when each memory cell is programmed.

In more detail, to satisfy the above condition, the manufacturing system may adjust a thickness of the at least one ferroelectric layer or may selectively determine a ferroelectric material for forming the at least one ferroelectric layer. For example, to satisfy the above condition, the manufacturing system may form at least one ferroelectric layer with a ferroelectric material of $HfO_2$ doped with at least one of Zr and Si to have a high polarization voltage.

Afterwards, in step S640, the manufacturing system extends and forms the at least one channel layer in the vertical hole of the at least one ferroelectric layer in one direction. In this case, the manufacturing system may form the at least one channel layer with a semiconductor material including Zn, In, Ga, a Group 4 semiconductor material or a Group 3-5 compound having a C-axis aligned crystal (CAAC) crystal structure.

In this case, in the three-dimensional flash memory manufacturing method according to another embodiment, the manufacturing system may continuously perform step S630 and step S640 by using the ALD process.

Afterwards, in operation S650, the manufacturing system may remove the plurality of sacrificial layers and may fill the plurality of electrode layers in spaces where the plurality of sacrificial layers are removed.

The three-dimensional flash memory manufacturing method described above is not limited or restricted to step S610 to step S650, and may include various steps for manufacturing the three-dimensional flash memory described with reference to FIG. 3.

Figure 7:
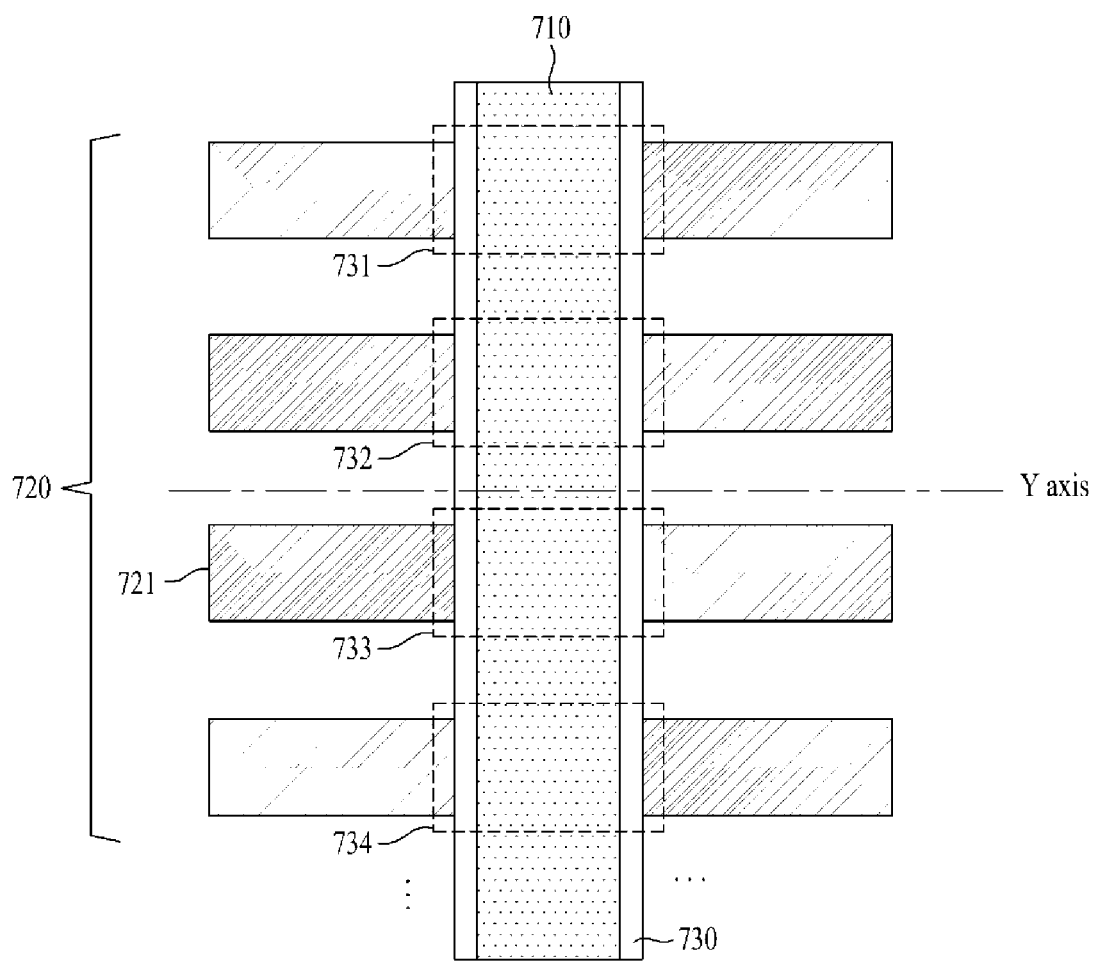
FIG. 7 is a cross-sectional view illustrating a three-dimensional flash memory according to an embodiment.
Figure 9:
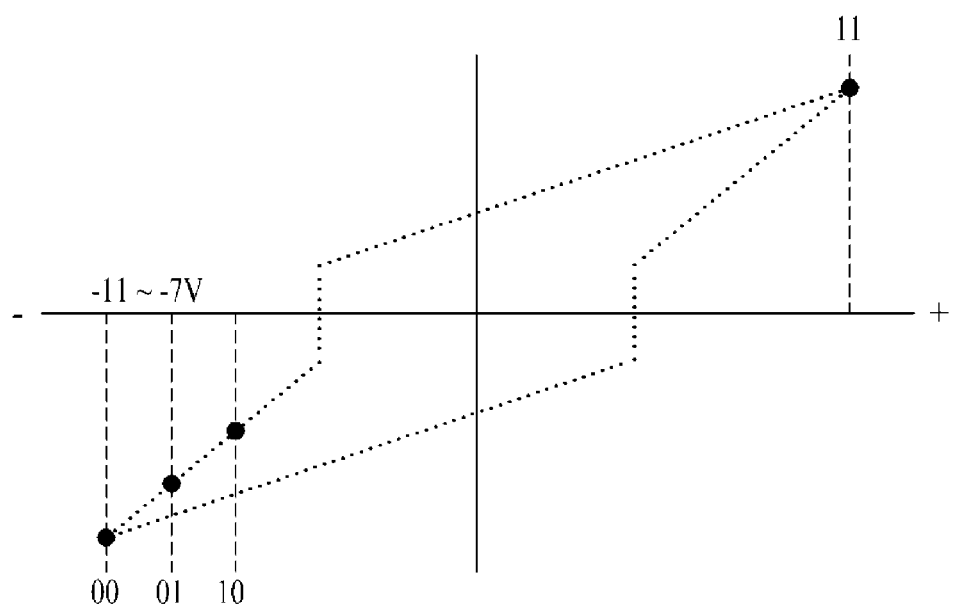

FIG. 7 is a cross-sectional view illustrating a three-dimensional flash memory according to an embodiment, and FIGS. 8 and 9 are diagrams for describing a multi-level of a three-dimensional flash memory according to an embodiment. In detail, FIG. 8 is a diagram for describing how a polarization charge amount of at least one ferroelectric layer changes, in a three-dimensional flash memory according to an embodiment, and FIG. 9 is a diagram for describing each operation voltage when a three-dimensional flash memory according to an embodiment implements a multi-level.

Referring to FIGS. 7 to 9, a three-dimensional flash memory 700 according to an embodiment includes at least one channel layer 710, a plurality of electrode layers 720, and at least one ferroelectric layer 730.

The at least one channel layer 710 may be extended and formed in one direction (e.g., the z-axis direction in FIG. 2) on a substrate (not illustrated). In this case, the at least one channel layer 710 may be formed by a selective epitaxial growth process or a phase change epitaxial process in which a substrate is used as a seed, and may further include a buried layer (not illustrated) that is disposed in a hollow tubular shape so as to fill the inside thereof as illustrated in FIG. 2.

The at least one channel layer 710 may be formed of a semiconductor material including Zn, In, Ga, a Group 4 semiconductor material, or a Group 3-5 compound having a C-axis aligned crystal (CAAC) crystal structure. As such, a cell current may increase, a leakage current may decrease, and a temperature-resistant reliability characteristic may be improved. For example, the at least one channel layer 710 may be formed of a $ZnO_x$-based material including at least one of AZO, ZTO, IZO, ITO, IGZO, and Ag—ZnO. However, the at least one channel layer 710 is not limited thereto, and may be formed of single crystal silicon or poly-silicon like a conventional channel layer.

Also, although not illustrated in drawing, a drain line (not illustrated) may be connected on the at least one channel layer 710.

The plurality of electrode layers 720 are stacked to be perpendicular to the at least one channel layer 710 and are extended and formed in another direction (e.g., the y-axis direction in FIG. 2) perpendicular to the one direction. A conductive material such as tungsten, titanium, or tantalum may be used as a material for forming the plurality of electrode layers 720.

The at least one ferroelectric layer 730 surrounds the at least one channel layer 710 and is interposed between the at least one channel layer 710 and the plurality of electrode layers 720 in one direction (e.g., the z-axis direction in FIG. 2), and the at least one ferroelectric layer 730 is used as data storage as a plurality of memory cells 731, 732, 733, and 734 are implemented in regions where the at least one ferroelectric layer 730 and the plurality of electrode layers 720 are in contact with each other.

In this case, the at least one ferroelectric layer 730 may be formed of a ferroelectric material of $HfO_2$ having an orthorhombic crystal structure, and for example, may be formed of a ferroelectric material of $HfO_2$ doped with at least one material of Al, Zr, or Si. For another example, the at least one ferroelectric layer 730 may be formed of a ferroelectric material including at least one of PZT(Pb(Zr, Ti)$O_3$), PTO (PbTiO$_3$), SBT(SrBi$_2$Ti$_2$O$_9$), BLT(Bi(La, Ti)O$_3$), PLZT(Pb (La, Zr)TiO$_3$), BST(Bi(Sr, Ti)O$_3$), barium titanate (BaTiO$_3$), P(VDF-TrFE), PVDF, AlO$_x$, ZnO$_x$, TiO$_x$, TaO$_x$ or InO$_x$.

Below, that it is used as data storage means that each of the regions of the at least one ferroelectric layer 730 constituting the plurality of memory cells 731, 732, 733, and 734 indicates (or stores) a value of binary data by using a voltage change according to a polarization phenomenon.

Here, because the at least one ferroelectric layer 730 is implemented with a single thin layer of 20 nm or less by using a ferroelectric material, a thickness of the at least one ferroelectric layer 720 may be markedly thin compared to the existing ONO layer. Accordingly, a low operation voltage may be used compared to a three-dimensional flash memory using the existing ONO layer, and the degree of integration in the horizontal direction may be improved. However, it is not limited or restricted thereto. For example, the at least one ferroelectric layer 730 may be formed of a plurality of thin layers, as well as a single thin layer. In this case, a total thickness of the plurality of thin layers may be maintained at 20 nm or less.

The three-dimensional flash memory 700 with the above structure may implement a multi-level of a target memory cell 733 by changing a polarization charge amount of a partial region of the at least one ferroelectric layer 730, which corresponds to the target memory cell 733 targeted for a program operation from among the plurality of memory cells 731, 732, 733, and 734. Below, the partial region of the at least one ferroelectric layer 730 corresponding to the target memory cell 733 means the target memory cell 733 itself.

In more detail, a polarization charge amount corresponding when atoms of the target memory cell 733 are polarized as shown in case (a) of FIG. 8 is different from a polarization charge amount corresponding when atoms of the target memory cell 733 are polarized as shown in case (b). Likewise, polarization charge amounts respectively corresponding to case (c) and case (d) are different from the polarization charge amounts respectively corresponding to case (a) and case (b).

As such, the three-dimensional flash memory 700 may change a polarization charge amount of the target memory cell 733 depending on the number of controlled atoms or a polarization rotation angle, by controlling the number of polarized atoms or a polarization rotation angle in the target memory cell 733. For example, like case (a), case (b), case (c), and case (d), the three-dimensional flash memory 700 may differently change a polarization charge amount of the target memory cell 733 by differently controlling the number of polarized atoms or a polarization rotation angle in the target memory cell 733.

In more detail, the three-dimensional flash memory 700 may change a polarization charge amount of the target memory cell 733 so as to correspond to a first program state by controlling the number of polarized atoms or a polarization rotation angle in the target memory cell 733 like case (a), may change a polarization charge amount of the target memory cell 733 so as to correspond to a second program state by controlling the number of polarized atoms or a polarization rotation angle in the target memory cell 733 like case (c), may change a polarization charge amount of the target memory cell 733 so as to correspond to a third program state by controlling the number of polarized atoms or a polarization rotation angle in the target memory cell 733 like case (d), and may change a polarization charge amount of the target memory cell 733 so as to correspond to an erase state by controlling the number of polarized atoms or a polarization rotation angle in the target memory cell 733 like case (b).

In this case, the number of polarized atoms or a polarization rotation angle in the target memory cell 733 may be controlled as a voltage to be applied to the target memory cell 733 is adjusted. That is, the three-dimensional flash memory 700 may change a polarization charge amount in the target memory cell 733, by adjusting a voltage to be applied to the target memory cell 733 between a negative value and a positive value such that the number of polarized atoms or a polarization rotation angle in the target memory cell 733 is controlled.

In this regard, referring to FIG. 9 further, the three-dimensional flash memory 700 may apply a first program voltage of a negative value (e.g., −10 V) to the target memory cell 733 such that the number of polarized atoms or a polarization rotation angle in the target memory cell 733 is controlled as illustrated in case (a) of FIG. 8, that is, may program binary data of "00" by changing a polarization charge amount of the target memory cell 733 so as to correspond to the first program state. Likewise, the three-dimensional flash memory 700 may apply a second program voltage of a negative value (e.g., −9 V) to the target memory cell 733 such that the number of polarized atoms or a polarization rotation angle in the target memory cell 733 is controlled as illustrated in case (c) of FIG. 8, that is, may program binary data of "01" by changing a polarization charge amount of the target memory cell 733 so as to correspond to the second program state, and may apply a third program voltage of a negative value (e.g., −8 V) to the target memory cell 733 such that the number of polarized atoms or a polarization rotation angle in the target memory cell 733 is controlled as illustrated in case (d) of FIG. 8, that is, may program binary data of "10" by changing a polarization charge amount of the target memory cell 733 so as to correspond to the third program state.

Also, the three-dimensional flash memory 700 may apply a fourth program voltage of a positive value (e.g., 10V) to the target memory cell 733 such that the number of polarized atoms or a polarization rotation angle in the target memory cell 733 is controlled as illustrated in case (b) of FIG. 8, that is, may program binary data of "11" by changing a polarization charge amount of the target memory cell 733 so as to correspond to the fourth program state. The polarization charge amount of the fourth program state may be the polarization charge amount of the erase state described above, and the three-dimensional flash memory 700 may use the erase state of the target memory cell 733, which is caused by applying a voltage of a positive value to the target memory cell 733, as the fourth program state, thereby contributing a multi-level of the target memory cell 733.

That is, the three-dimensional flash memory 700 may change a polarization charge amount of the at least one ferroelectric layer 730 between case (a) to case (d) of FIG. 8, by adjusting a program voltage to be applied to the target memory cell 733 between −10 V being a negative value and 10 V being a positive value like the above example. Accordingly, the three-dimensional flash memory 700 may implement a multi-level in which case (a) indicates binary data of "00", case (c) indicates binary data of "01", case (d) indicates binary data of "10", and case (d) indicates binary data of "11".

Here, a range between a negative value and a positive value, in which a program voltage to be applied to the target memory cell 733 is adjusted, may be determined based on a thickness of the at least one ferroelectric layer 730 and a breakdown voltage of the at least one ferroelectric layer 730. In other words, the range between a negative value and a positive value, in which a program voltage to be applied to the target memory cell 733 is adjusted, may be determined based on a margin of a breakdown voltage according to a thickness of the at least one ferroelectric layer 730. For example, in the case where a thickness of the at least one ferroelectric layer 730 is 20 nm, a margin of a breakdown voltage of the at least one ferroelectric layer 730 may be about 16 V. In this case, the range between a negative value and a positive value, in which a program voltage to be applied to the target memory cell 733 is adjusted, may be determined as a range from −14 V to 10 V. For another example, in the case where a thickness of the at least one ferroelectric layer 730 is 15 nm, a margin of a breakdown voltage of the at least one ferroelectric layer 730 may be about 12V. In this case, the range between a negative value and a positive value, in which a program voltage to be applied to the target memory cell 733 is adjusted, may be determined as a range from −12 V to 10 V.

As such, the three-dimensional flash memory 700 may adjust a program voltage to be applied to the target memory cell 733 in the range between a negative value and a positive value determined based on the thickness of the at least one ferroelectric layer 730 and the breakdown voltage of the at least one ferroelectric layer 730.

As described above, the three-dimensional flash memory 700 may adjust a program voltage to be applied to the target memory cell 733 between a negative value and a positive value (e.g., may apply program voltages of different a negative value and a positive value to the target memory cell 733) such that a polarization charge amount of the at least one ferroelectric layer 730 changes, thereby implementing a multi-level of the target memory cell 733.

In this case, that program voltages of negative values are applied to the target memory cell 733 (i.e., the first, second, and third program voltages described above are applied thereto) may be performed by applying voltages of different negative values (i.e., a voltage of a negative value corresponding to the first program voltage, a voltage of a negative value corresponding to the second program voltage, and a voltage of a negative value corresponding to the third program voltage) to the electrode layer 721 corresponding to the target memory cell 733 from among the plurality of electrode layers 720 and applying a voltage of 0 V to the channel layer 710 of a string where the target memory cell 733 is placed or to the channel layer 710 from the substrate corresponding to the string.

However, it is not limited or restricted thereto. For example, that program voltages of negative values are applied to the target memory cell 733 (i.e., the first, second, and third program voltages described above are applied thereto) may be performed by applying a voltage of 0 V to the electrode layer 721 corresponding to the target memory cell 733 from among the plurality of electrode layers 720 and applying voltages of different positive voltages (i.e., a voltage of a positive value corresponding to the first program voltage, a voltage of a positive value corresponding to the second program voltage, and a voltage of a positive value corresponding to the third program voltage) to the channel layer 710 of a string where the target memory cell 733 is placed or to the channel layer 710 from the substrate corresponding to the string.

A way to apply a program voltage of a negative value to the target memory cell 733 will be described with reference to FIGS. 10 and 11 below.

An example in which the three-dimensional flash memory 700 implements a multi-level of 2 bits is described above, but is not limited nor restricted thereto. A multi-level of 3 or more bits may also be implemented based on the same principle (i.e., a principle of implementing a multi-level by adjusting a program voltage to be applied to the target memory cell 733 between a negative value and a positive value such that a polarization charge amount of the target memory cell 733 changes).

Figure 10:
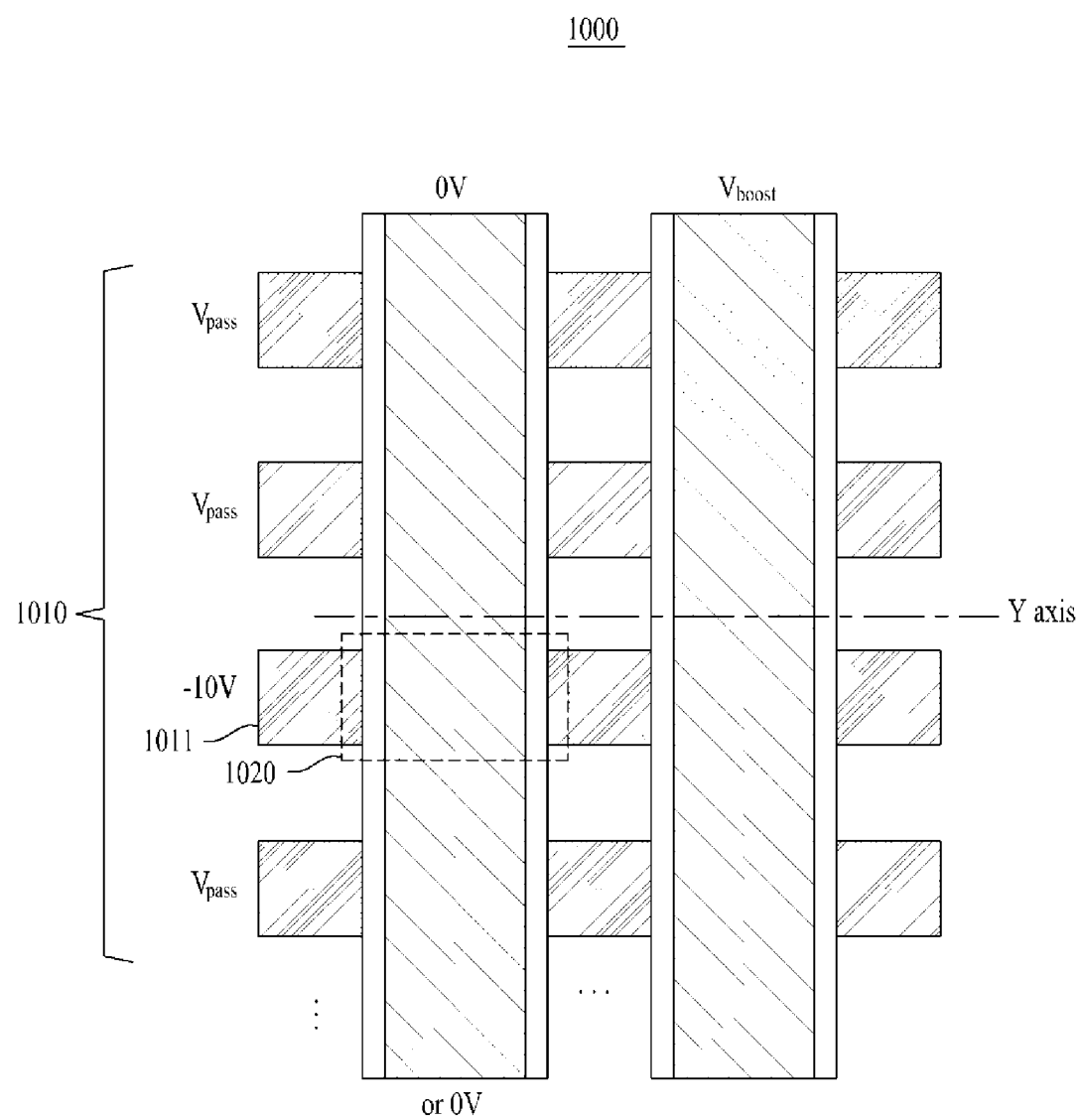
FIGS. 10 and 11 are cross-sectional views for describing a program operation of a three-dimensional flash memory according to an embodiment.
Figure 11:
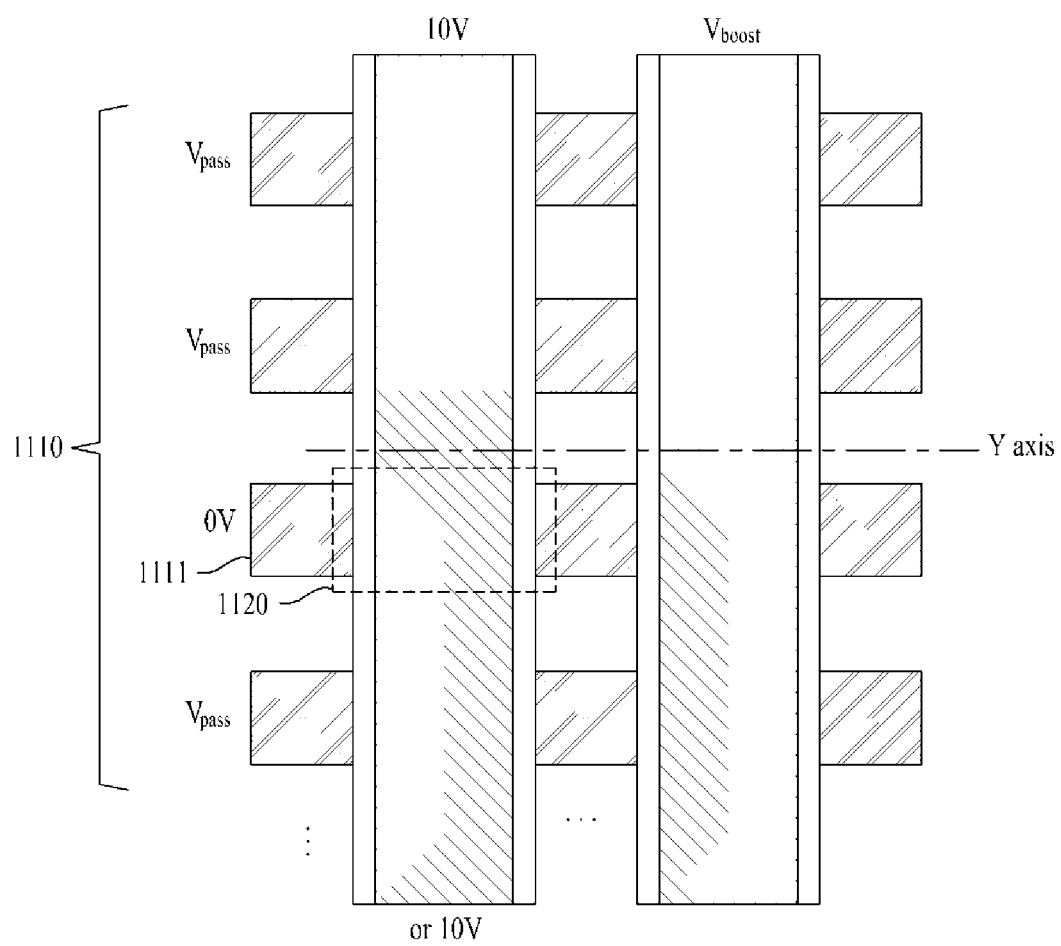

FIGS. 10 and 11 are cross-sectional views for describing a program operation of a three-dimensional flash memory according to an embodiment.

Referring to FIG. 10, a three-dimensional flash memory 1000 may apply a program voltage of a negative value to a target memory cell 1020 by applying a voltage of a negative value to an electrode layer 1011 corresponding to the target memory cell 1020 of a plurality of electrode layers 1010 and applying a voltage of 0 V to a channel layer of a string where the target memory cell 1020 is placed or to a channel layer from a substrate corresponding to the string. In this case, a pass voltage may be applied to each of the remaining electrode layers other than the electrode layer 1011 corresponding to the target memory cell 1020 from among the plurality of electrode layers 1010.

For example, for the target memory cell 1020 to have a polarization charge amount corresponding to case (a) of FIG. 8, the three-dimensional flash memory 1000 may apply −10 V being a first program voltage to the target memory cell 1020. To this end, the three-dimensional flash memory 1000 may apply −10 V to the electrode layer 1011 corresponding to the target memory cell 1020 of the plurality of electrode layers 1010 and may apply a voltage of 0 V to the channel layer of the string where the target memory cell 1020 is placed or to the channel layer from the substrate corresponding to the string, and thus, −10 V may be applied to the target memory cell 1020.

Like case (a), in case (c) and case (d) of FIG. 8, because a program voltage of a negative value is applied, the same manner may be used except that only a value of a voltage to be applied to the electrode layer 1011 is changed (e.g., in case (c), −9 V is applied to the electrode layer 1011; in case (d), −8 V is applied to the electrode layer 1011). In case (b), because a program voltage of a positive value is applied, an erase operation to be described with reference to FIG. 12 below may be utilized.

However, the way to apply a program voltage of a negative value to the target memory cell 1020 is capable of being implemented in any other way, as well as the described way. In this regard, referring to FIG. 11, a three-dimensional flash memory 1100 may apply a program voltage of a negative value to a target memory cell 1120 by applying a voltage of 0 V to an electrode layer 1111 corresponding to the target memory cell 1120 of a plurality of electrode layers 1110 and applying a voltage of a positive value to the channel layer of the string where the target memory cell 1120 is placed or to the channel layer from the substrate corresponding to the string.

Here, the voltage of the positive value applied to the channel layer of the string or to the channel layer from the substrate corresponding to the string may correspond to a result of changing a sign of a program voltage of a negative value to be applied to the target memory cell 1120, as a value corresponding to the program voltage of the negative value to be applied to the target memory cell 1120.

For example, for the target memory cell 1120 to have a polarization charge amount corresponding to case (a) of FIG. 8, the three-dimensional flash memory 1100 may apply −10 V being a first program voltage to the target memory cell 1120. To this end, the three-dimensional flash memory 1100 may apply 0 V to the electrode layer 1111 corresponding to the target memory cell 1120 of the plurality of electrode layers 1110 and may apply a voltage of 10 V to the channel layer of the string where the target memory cell 1120 is placed or to the channel layer from the substrate corresponding to the string, and thus, 10 V may be applied to the target memory cell 1120.

Like case (a), in case (c) and case (d) of FIG. 8, because a program voltage of a negative value is applied, the same manner may be used except that only a value of a voltage to be applied to the electrode layer 1111 is changed (e.g., in case (c), 9 V is applied to the channel layer of the string or to the channel layer from the substrate corresponding to the string; in case (d), 8 V is applied to the channel layer of the string or to the channel layer from the substrate corresponding to the string). In case (b), because a program voltage of a positive value is applied, an erase operation to be described with reference to FIG. 12 below may be utilized.

Figure 12:
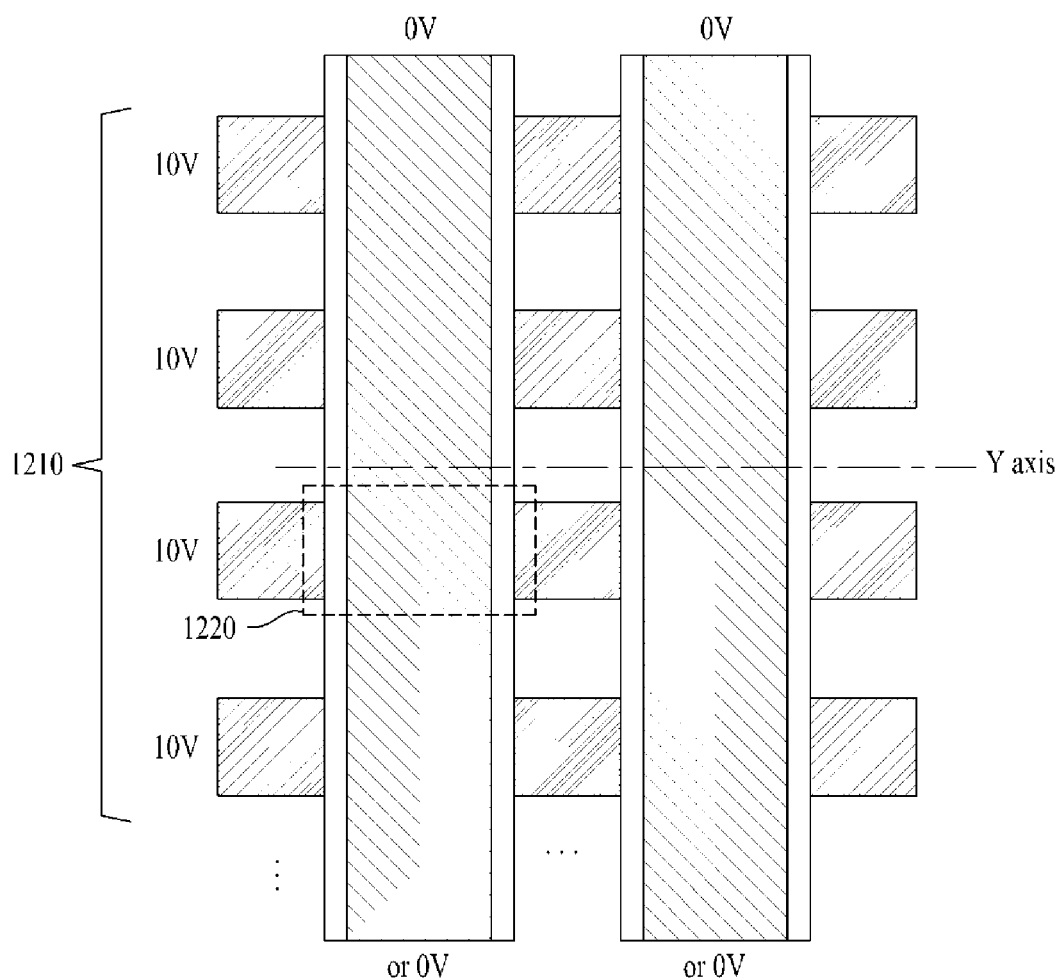
FIG. 12 is a cross-sectional view for describing an erase operation of a three-dimensional flash memory according to an embodiment.

FIG. 12 is a cross-sectional view for describing an erase operation of a three-dimensional flash memory according to an embodiment.

Referring to FIG. 12, a three-dimensional flash memory 1200 according to an embodiment may perform an erase operation on a plurality of memory cells included in the three-dimensional flash memory 1200 by applying an erase voltage (e.g., 10 V) to each of a plurality of electrode layers 1210 and applying a voltage of 0 V to a channel layer of each string or a channel layer from the substrate corresponding to the string.

A polarization charge amount that is determined after the erase operation may be used as one state for a multi-level of a target memory cell 1220. That is, in the three-dimensional flash memory 1200, because an erase state of the target memory cell 1220 indicates one (e.g., "11") of binary data, an erase voltage of 10 V being a positive value to be applied to the target memory cell 1220 in the erase operation (i.e., an erase voltage of 10 V being a positive value to be applied to each of the plurality of electrode layers 1210) may be referred to as a "program voltage" of a positive value for programming binary data of "11".

Accordingly, as described with reference to FIGS. 7 to 12, a three-dimensional flash memory may apply program voltages of different negative values to a target memory cell and may apply a program voltage of a positive value (i.e., an erase voltage of a positive value) for utilization of an erase state, and thus, a multi-level of the three-dimensional flash memory may be implemented.

A read operation of the three-dimensional flash memory implementing the multi-level will be described with reference to FIG. 13 below.

Figure 13:
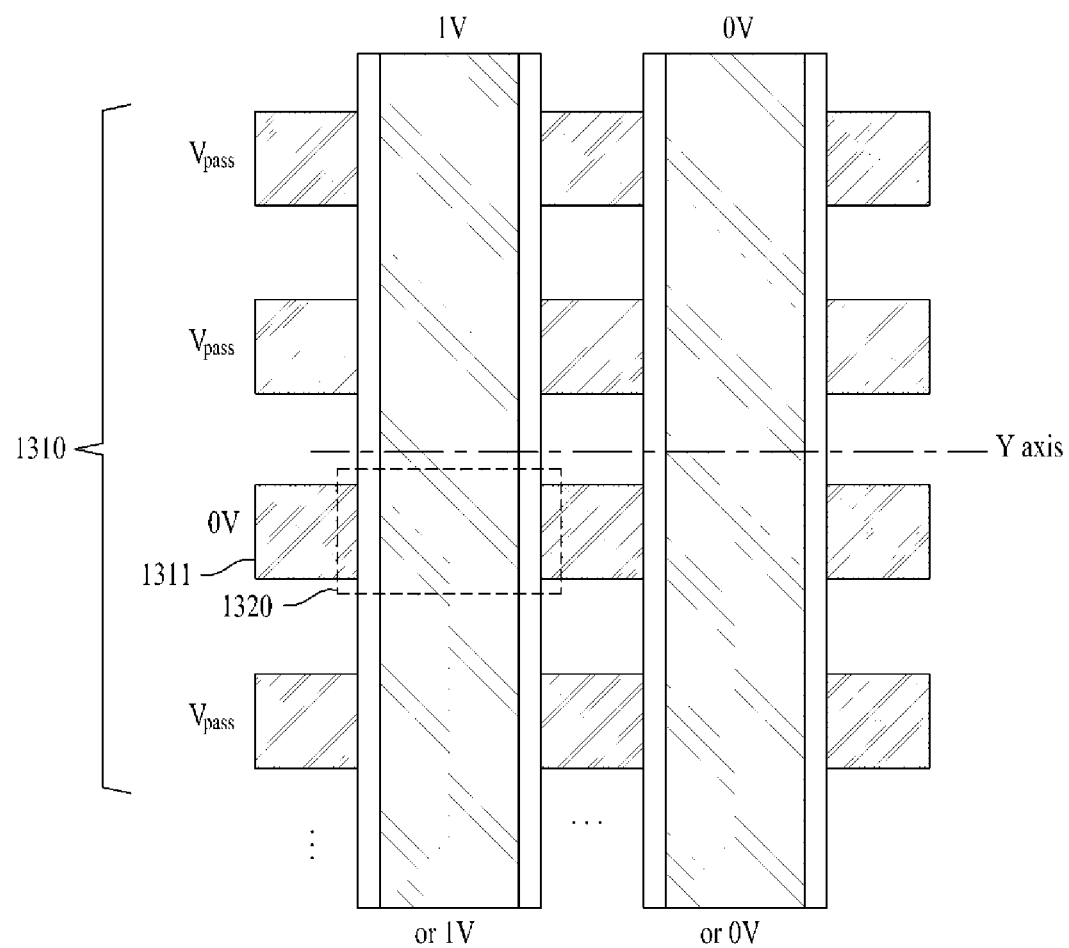
FIG. 13 is a cross-sectional view for describing a read operation of a three-dimensional flash memory according to an embodiment.

FIG. 13 is a cross-sectional view for describing a read operation of a three-dimensional flash memory according to an embodiment.

Referring to FIG. 13, a three-dimensional flash memory 1300 may perform a read operation on a target memory cell 1320 by applying 0 V to an electrode layer 1311 corresponding to the target memory cell 1320 of a plurality of electrode layers 1310, applying a pass voltage to the remaining electrode layers 1311, and applying a read voltage (e.g., 1 V) to a channel layer of a string where the target memory cell 1320 is placed or to a channel layer from the substrate corresponding to the string. As such, binary data, which the target memory cell 1320 indicates, from among multi-leveled binary data may be read.

Figure 14:
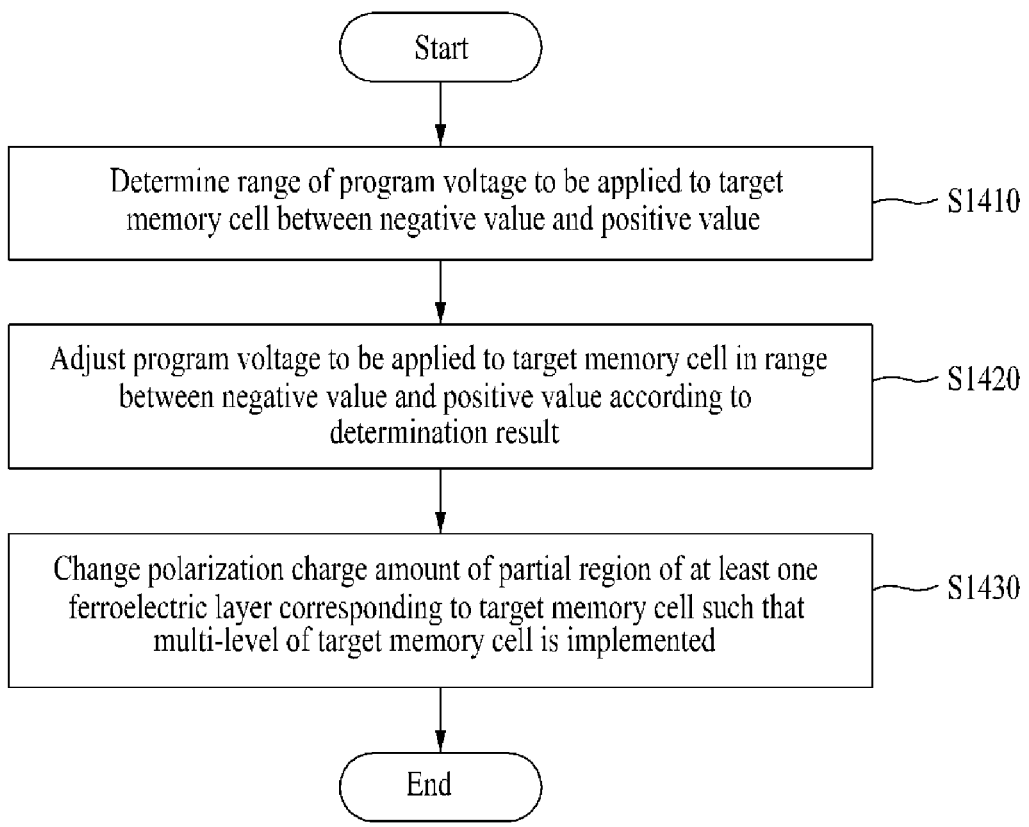
FIG. 14 is a flowchart illustrating a method of implementing a multi-level of a three-dimensional flash memory according to an embodiment.

FIG. 14 is a flowchart illustrating a method of implementing a multi-level of a three-dimensional flash memory according to an embodiment. Below, the subject that performs a multi-level implementing method of a three-dimensional flash may be the three-dimensional flash memory described with reference to FIGS. 7 to 13.

Referring to FIG. 14, in step S1410, a three-dimensional flash memory determines a range of a program voltage to be applied to a target memory cell targeted for a program operation from among a plurality of memory cells, between a negative value and a positive value.

In more detail, in step S1410, the three-dimensional flash memory may determine the range of the program voltage to be applied to the target memory cell between a negative value and a positive value, based on a thickness of at least one ferroelectric layer and a breakdown voltage of the at least one ferroelectric layer.

Next, in step S1420, the three-dimensional flash memory adjusts the program voltage to be applied to the target memory cell in a range between a negative value and a positive value according to a determination result.

In this case, to adjust the program voltage to be applied to the target memory cell in the range between the negative value and the positive value in step S1420 may mean to apply program voltages of different negative values and a program voltage of a positive value to the target memory cell.

A first way or a second way may be used as a way to apply each of program voltages of different negative values to a target memory cell. According to the first way, a voltage of a negative value may be applied to an electrode layer corresponding to the target memory cell from among a plurality of electrode layers, a voltage of 0 V may be applied to a channel layer of a string where the target memory cell is placed or to a channel layer from the substrate corresponding to the string, and a program voltage of a negative value may be applied to the target memory cell. According to the second way, a voltage of 0 V may be applied to the electrode layer corresponding to the target memory cell from among the plurality of electrode layers, a voltage of a positive value may be applied to the channel layer of the string where the target memory cell is placed or to the channel layer from the substrate corresponding to the string, and a program voltage of a negative value may be applied to the target memory cell.

Afterwards, in step S1430, the three-dimensional flash memory may adjust the program voltage to be applied to the target memory cell such that a polarization charge amount of a partial region of at least one ferroelectric layer corresponding to the target memory cell changes, and thus, a multi-level of the target memory cell is implemented.

Case (a) to case (d) of FIG. 8 will be described as an example of step S1410 to step S1430. The three-dimensional flash memory may determine a range of a program voltage to be applied to a target memory cell as −10 V to 10 V in step S1410. Then, in step S1420, the three-dimensional flash memory may apply a first program voltage (e.g., −10 V) being a negative value such that the target memory cell has a polarization charge amount corresponding to case (a) of FIG. 8, may apply a second program voltage (e.g., −9 V) being a negative value such that the target memory cell has a polarization charge amount corresponding to case (c) of FIG. 8, may apply a third program voltage (e.g., −8 V) being a negative value such that the target memory cell has a polarization charge amount corresponding to case (d) of FIG. 8, or may apply a fourth program voltage (e.g., 10 V) being a positive value such that the target memory cell has a polarization charge amount corresponding to case (b) of FIG. 8. Accordingly, the three-dimensional flash memory may implement a multi-level for the target memory cell in step S1430.

While a few embodiments have been shown and described with reference to the accompanying drawings, it will be apparent to those skilled in the art that various modifications and variations can be made from the foregoing descriptions. For example, adequate effects may be achieved even if the foregoing processes and methods are carried out in different order than described above, and/or the aforementioned elements, such as systems, structures, devices, or circuits, are combined or coupled in different forms and modes than as described above or be substituted or switched with other components or equivalents.

Therefore, other implements, other embodiments, and equivalents to claims are within the scope of the following claims.

The invention claimed is:

1. A three-dimensional flash memory comprising:
   at least one channel layer extended and formed in one direction;
   at least one ferroelectric layer extended and formed in the one direction to surround the at least one channel layer and used as data storage; and
   a plurality of electrode layers stacked to be vertically connected to the at least one ferroelectric layer,
   wherein the at least one ferroelectric layer is formed to implement a plurality of memory cells in regions thereof being in contact with the plurality of electrode layers and to satisfy a condition where a turn-on voltage of the at least one channel layer is smaller than an operation voltage of each of the memory cells and is greater than a threshold voltage when each of the memory cells is programmed.

2. The three-dimensional flash memory of claim 1, wherein a thickness of the at least one ferroelectric layer is adjusted to satisfy the condition.

3. The three-dimensional flash memory of claim 1, wherein the at least one ferroelectric layer is formed of a ferroelectric material of $HfO_2$ with an orthorhombic crystal structure.

4. The three-dimensional flash memory of claim 1, wherein the at least one ferroelectric layer is formed of a ferroelectric material including at least one of PZT(Pb(Zr, Ti)O$_3$), PTO(PbTiO$_3$), SBT(SrBi$_2$Ti$_2$O$_3$), BLT(Bi(La, Ti)O$_3$), PLZT(Pb(La, Zr)TiO$_3$), BST(Bi(Sr, Ti)O$_3$), barium titanate (BaTiO$_3$), P(VDF-TrFE), PVDF, AlO$_x$, ZnO$_x$, TiO$_x$, TaO$_x$ or InO$_x$.

5. The three-dimensional flash memory of claim 1, wherein the at least one channel layer is formed of a semiconductor material including Zn, In, Ga, a Group 4 semiconductor material or a Group 3-5 compound having a C-axis aligned crystal (CAAC) crystal structure.

6. A method of manufacturing the three-dimensional flash memory of claim 1 comprising:
preparing, on a substrate, a mold structure in which a plurality of interlayer insulating layers and a plurality of electrode layers are stacked alternately;
extending and forming at least one string hole, which penetrates the mold structure to expose the substrate, in one direction;
extending and forming at least one ferroelectric layer used as data storage in the at least one string hole, wherein the at least one ferroelectric layer includes a vertical hole therein; and
extending and forming at least one channel layer in the vertical hole of the at least one ferroelectric layer in the one direction.

7. A method of manufacturing the three-dimensional flash memory of claim 1 comprising:
preparing, on a substrate, a mold structure in which a plurality of interlayer insulating layers and a plurality of sacrificial layers are stacked alternately;
extending and forming at least one string hole, which penetrates the mold structure to expose the substrate, in one direction;
extending and forming at least one ferroelectric layer used as data storage in the at least one string hole, wherein the at least one ferroelectric layer includes a vertical hole therein;
extending and forming at least one channel layer in the vertical hole of the at least one ferroelectric layer in the one direction; and
removing the plurality of sacrificial layers and filling a plurality of electrode layers in spaces in which the plurality of sacrificial layers are removed.

8. A ferroelectric material-based three-dimensional flash memory which implements a multi-level, the three-dimensional flash memory comprising:
at least one channel layer extended and formed in one direction on a substrate;
a plurality of electrode layers stacked to be perpendicular to the at least one channel layer; and
at least one ferroelectric layer interposed between the at least one channel layer and the plurality of electrode layers in the one direction to surround the at least one channel layer and used as data storage to implement a plurality of memory cells in regions thereof being in contact with the plurality of electrode layers,
wherein a multi-level for a target memory cell targeted for a program operation of the plurality of memory cells is implemented by changing a polarization charge amount of a partial region of the at least one ferroelectric layer corresponding to the target memory cell, and
the three-dimensional flash memory adjusts a program voltage to be applied to the target memory cell between a negative value and a positive value to change the polarization charge amount of the at least one ferroelectric layer.

9. The three-dimensional flash memory of claim 8, wherein the three-dimensional flash memory applies program voltages of different a negative value and a positive value to the target memory cell between a negative value and a positive value to change the polarization charge amount of the at least one ferroelectric layer.

10. The three-dimensional flash memory of claim 8, wherein the three-dimensional flash memory adjusts a program voltage to be applied to the target memory cell between a negative value and a positive value such that the number of polarized atoms or a polarization rotation angle in the partial region of the at least one ferroelectric layer changes, and changes the polarization charge amount depending on the number of polarized atoms or the polarization rotation angle thus controlled.

11. A multi-level implementing method of a three-dimensional flash memory which includes at least one channel layer extended and formed in one direction on a substrate, a plurality of electrode layers stacked in a direction perpendicular to the at least one channel layer, and at least one ferroelectric layer interposed between the at least one channel layer and the plurality of electrode layers in the one direction to surround the at least one channel layer and used as data storage to implement a plurality of memory cells in regions thereof being in contact with the plurality of electrode layers, the method comprising:
determining a range of a program voltage to be applied to a target memory cell targeted for a program operation from among the plurality of memory cells, between a negative value and a positive value;
adjusting the program voltage to be applied to the target memory cell in a range between a negative value and a positive value according to the determination result; and
implementing a multi-level of the target memory cell by changing a polarization charge amount of a partial region of the at least one ferroelectric layer corresponding to the target memory cell, as the program voltage to be applied to the target memory cell is adjusted.

12. The method of claim 11, wherein the determining includes:
determining the range of the program voltage to be applied to the target memory cell between a negative value and a positive value, based on a thickness of the at least one ferroelectric layer and a breakdown voltage of the at least one ferroelectric layer.

* * * * *